(12) United States Patent
Baks et al.

(10) Patent No.: US 9,196,951 B2
(45) Date of Patent: Nov. 24, 2015

(54) MILLIMETER-WAVE RADIO FREQUENCY INTEGRATED CIRCUIT PACKAGES WITH INTEGRATED ANTENNAS

(71) Applicant: International Business Machines Corporation, Armonk, NY (US)

(72) Inventors: Christian W. Baks, Poughkeepsie, NY (US); Xiaoxiong Gu, White Plains, NY (US); MD. Rashidul Islam, Grayslake, IL (US); Duixian Liu, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 13/685,262

(22) Filed: Nov. 26, 2012

(65) Prior Publication Data

US 2014/0145883 A1    May 29, 2014

(51) Int. Cl.
*H01Q 1/38* (2006.01)
*H01Q 1/22* (2006.01)

(52) U.S. Cl.
CPC ......... *H01Q 1/2283* (2013.01); *Y10T 29/49016* (2015.01)

(58) Field of Classification Search
USPC .............................. 29/600; 343/850, 700 MS
See application file for complete search history.

(56) References Cited

U.S. PATENT DOCUMENTS

| | | | |
|---|---|---|---|
| 4,835,538 A * | 5/1989 | McKenna et al. | 343/700 MS |
| 6,594,893 B2 | 7/2003 | Bailey et al. | |
| 2008/0291115 A1 | 11/2008 | Doan et al. | |
| 2009/0322643 A1 | 12/2009 | Choudhury | |
| 2011/0285606 A1 | 11/2011 | De Graauw et al. | |
| 2012/0075154 A1 | 3/2012 | Biglarbegian et al. | |
| 2013/0099006 A1 * | 4/2013 | Hong et al. | 235/492 |

FOREIGN PATENT DOCUMENTS

| | | |
|---|---|---|
| CN | 101662076 A | 3/2010 |
| JP | 2003168920 A | 6/2003 |

OTHER PUBLICATIONS

T. Seki et al., "Millimeter-Wave High-Efficiency Multilayer Parasitic Microstrip Antenna Array on Teflon Substrate," IEEE Transactions on Microwave Theory and Techniques, Jun. 2005, pp. 2101-2106, vol. 53, No. 6.

* cited by examiner

*Primary Examiner* — Dieu H Duong
(74) *Attorney, Agent, or Firm* — Anne V. Dougherty; Ryan, Mason & Lewis, LLP (57) ABSTRACT

A package structure includes a planar core structure, an antenna structure disposed on one side of the planar core structure, and an interface structure disposed on an opposite side of the planar core structure. The antenna structure and interface structure are each formed of a plurality of laminated layers, each laminated layer having a patterned conductive layer formed on an insulating layer. The antenna structure includes a planar antenna formed on one or more patterned conductive layers of the laminated layers. The interface structure includes a power plane, a ground plane, signal lines, and contact pads formed on one or more patterned conductive layers of the laminated layers of the interface structure. The package structure further includes an antenna feed line structure formed in, and routed through, the interface structure and the planar core structure, and connected to the planar antenna.

32 Claims, 9 Drawing Sheets

MILLIMETER-WAVE RADIO FREQUENCY INTEGRATED CIRCUIT PACKAGES WITH INTEGRATED ANTENNAS

STATEMENT REGARDING FEDERALLY SPONSORED RESEARCH OR DEVELOPMENT

This invention was made with Government support under Contract No. HR0011-11-C-0136 (awarded by the Department of Defense (DOD). The Government has certain rights in this invention.

TECHNICAL FIELD

The field generally relates to package structures with integrated antennas and, in particular, packaging structures and methods for integrally packaging antenna structures with semiconductor RFIC (radio frequency integrated circuit) chips to form compact integrated radio/wireless communications systems for millimeter wave (mm Wave) and Terahertz (THz) applications.

BACKGROUND

In a wireless network, the connectivity and communication between devices is achieved using antennas that are coupled to receivers or transmitters, in order to radiate the desired signals to or from other elements of the network. In conventional radio communication systems, such as millimeter-wave radios, discrete components are usually assembled with low integration levels. These systems are often assembled using expensive and bulky waveguides and package-level or board-level microstrip or stripline structures to interconnect semiconductors and their required transmitter or receiver antennas. With recent progress in semiconductor technology and packaging engineering, the dimensions of these radio communication systems have become smaller.

With some state of the art technologies, multilayer integrated antenna structures can be fabricated using multilayered printed circuit boards (PCB) (organic-based) or using low temperature co-fired ceramic (LTCC) technology (ceramic-based). These multilayered organic or ceramic integrated antenna structures can be connected to semiconductor IC chips using standard C4 (controlled collapse chip connection) techniques. Integrated antenna structures that are made with organic or ceramic-based packaging techniques are generally suitable for application operating frequencies in the 60 GHz band while achieving suitable performance. However, for operating frequencies in the 94 GHz band and above, the use of organic or ceramic-based multilayer antenna structures becomes problematic due to, e.g., low PCB and LTCC manufacturing tolerances and resolutions. Moreover, the package materials used for PCB and LTCC technologies are too lossy for high frequency applications. Thus, it is desirable to design package structures with integrated antennas coupled to semiconductor IC chips (e.g., RFIC chips) that provide high performance operation for applications with operating frequencies in the 94 GHz band and higher.

SUMMARY

In general, embodiments of the invention include packaging structures and methods for integrally packaging antenna structures with semiconductor RFIC (radio frequency integrated circuit) chips to form compact integrated radio/wireless communications systems for millimeter wave (mm-Wave) applications (e.g., 94 GHz) and higher.

For example, in one embodiment, a package structure includes a planar core structure, an antenna structure, and an interface structure. The antenna structure is disposed on a first side of the planar core structure and the interface structure is disposed on a second side of the planar core structure, opposite the first side. The antenna structure includes a plurality of laminated layers, each laminated layer having a patterned conductive layer formed on an insulating layer. The antenna structure includes a planar antenna formed on one or more patterned conductive layers of the laminated layers of the antenna structure. The interface structure includes a plurality of laminated layers, each laminated layer having a patterned conductive layer formed on an insulating layer. The interface structure includes a power plane, a ground plane, signal lines, and contact pads formed on one or more patterned conductive layers of the laminated layers of the interface structure. The package structure further includes an antenna feed line structure formed in, and routed through, the interface structure and the planar core structure, and connected to the planar antenna. In another embodiment of the invention, the package structure is mounted to a circuit board by connecting contact pads of the circuit board to contact pads of the interface structure.

In another embodiment, a method is provided for constructing a package structure. The method includes building an antenna structure on a first side of a planar core structure, and building an interface structure on a second side of the planar core structure, opposite the first side. The antenna structure is built by stacking a plurality of discrete laminated layers on top of each other on the first side of the planar core structure, wherein each discrete laminated layer forming the antenna structure comprises a patterned conductive layer formed on an insulating layer, wherein the antenna structure comprises a planar antenna formed on one or more patterned conductive layers of the laminated layers of the antenna structure. The interface structure is built by stacking a plurality of discrete laminated layers on top of each other on the second side of the planar core structure, wherein each discrete laminated layer forming the interface layer comprises a patterned conductive layer formed on an insulating layer, wherein the interface structure comprises a power plane, a ground plane, signal lines, and contact pads formed on one or more patterned conductive layers of the laminated layers of the interface structure. The method further comprises forming an antenna feed line structure in the package structure, which is routed through the interface structure and the planar core structure, and connected to the planar antenna.

These and other embodiments of invention will be described or become apparent from the following detailed description of embodiments, which is to be read in connection with the accompanying drawings.

DETAILED DESCRIPTION

Embodiments of the invention will now be discussed in further detail with regard to packaging structures and methods for integrally packaging antenna structures with semiconductor RFIC (radio frequency integrated circuit) chips to form compact integrated radio/wireless communications systems for millimeter wave (mmWave) applications (e.g., 94 GHz) and higher. In general, embodiments of the invention as shown in FIGS. 1-8 are package structure that comprise a central core substrate having a first (upper) build up structure on a first side thereof forming an antenna structure, and a second (bottom) build up structure on a second side thereof forming an interface structure. One or more antennas are formed in the upper buildup antenna structure, and low frequency packaging components such as power planes, control, and base band connections are formed in the bottom buildup interface structure to interface with an integrated circuit chip (e.g., RFIC chip). An antenna feed line structure has various sections formed in the antenna structure, core substrate and interface layer, connecting the antenna in the upper antenna structure to appropriate contact pads on the RFIC chip. Embodiments of the invention implement SLC (surface laminar circuit) manufacturing processes, or other similar manufacturing processes that can be used to build package structures having the requisite tolerances and design rules that are needed for building package components for high-frequency millimeter wave applications.

It is to be understood that the various layers and/or regions shown in the accompanying drawings are not drawn to scale, and that one or more layers and/or regions of a type commonly used in integrated chip packages may not be explicitly shown in a given drawing. This does not imply that the layers and/or regions not explicitly shown are omitted from the actual integrated chip packages. Moreover, the same or similar reference numbers used throughout the drawings are used to denote the same or similar features, elements, or structures, and thus, a detailed explanation of the same or similar features, elements, or structures will not be repeated for each of the drawings.

Figure 1:
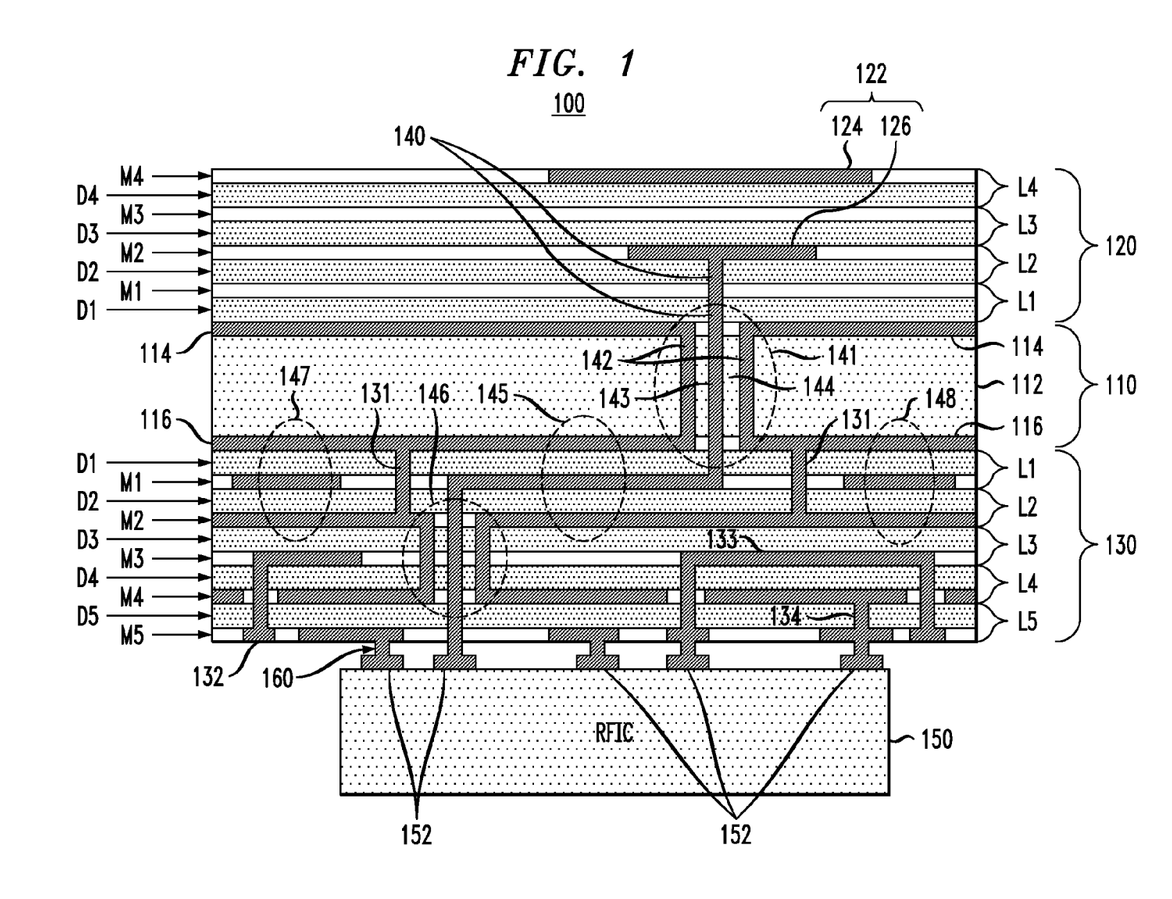
FIG. 1 schematically depicts a package structure according to an embodiment of the invention.

FIG. 1 schematically depicts a package structure according to an embodiment of the invention. In particular, FIG. 1 is a side schematic view of a package structure 100 comprising a planar core structure 110, an antenna structure 120 disposed on a first (upper) side of the planar core structure 110, an interface structure 130 disposed on a second (bottom) side of the planar core structure 110, an antenna feed line structure (140, 141, 145, 146), and an integrated circuit chip 150 (e.g., RFIC chip). The antenna structure 120 comprises a plurality of laminated layers (L1, L2, L3, L4), wherein each laminated layer (L1, L2, L3, L4) comprises a respective patterned conductive layer (M1, M2, M3, M4) formed on a respective dielectric/insulating layer (D1, D2, D3, D3), which form various components in the antenna structure 120. The interface layer 130 comprises a plurality of laminated layers (L1, L2, L3, L4, L5), wherein each laminated layer (L1, L2, L3, L4, L5) comprises a respective patterned conductive layer (M1, M2, M3, M4, M5) formed on a respective dielectric/insulating layer (D1, D2, D3, D3, D5). The planar core structure 110 comprises a substrate layer 112 having a first ground plane 114 formed on a first side of the substrate layer 112, and a second ground plane 116 formed on a second side of the substrate layer 112.

The antenna structure 120 comprises a planar antenna 122 that is formed by one or more patterned conductive layers of the laminated layers of the antenna structure 120. In particular, the planar antenna 122 shown in FIG. 1 is a probe fed stacked patch antenna structure comprising a first radiator element 124 patterned on a conductive layer M4 of an uppermost laminated layer L4 of the antenna structure 120, and a second radiator element 126 patterned on a conductive layer M2 of a second laminated layer L2 of the antenna structure 120, disposed below the uppermost laminated layer L4. The first radiator element 124 is larger in area than the second radiator element 126. With this antenna configuration, the ground plane 114 formed on the first side of the core substrate 112 serves as an antenna ground plane for the antenna radiators 124, 126.

The antenna structure 120 further comprises a plurality of conductive vias 140 that form a portion of the antenna feed line structure. The conductive vias 140 are formed in the first and second insulating layers D1, D2 of the first and second laminated layers L1, L2. The conductive vias 140 provide a vertical probe connection between the second antenna radiator 126 and a vertical transition structure 141 that is formed in the planar core structure 110. The vertical transition structure 141 comprises a plurality of ground vias 142 that are formed through the core substrate 112 connecting the first and second ground planes 114 and 116 on the first and second sides of the core substrate 112. The vertical transition structure 141 further comprises a center vertical conductor 143 that extends through the core substrate 112 connecting to the vertical vias 140. The vertical ground vias 142 comprise a series of separate vias that are formed through the core substrate 112 surrounding the center vertical conductor 143, thus forming a transmission line structure that is similar to a coaxial transmission line, wherein the surrounding vertical ground vias 142 serve as an outer (shielding) conductor, and the center vertical via 143 serves as a center (signal) conductor. The plurality of vertical ground vias 142 may be arranged in a circular pattern surrounding the center vertical conductor 143, or other suitable pattern. An insulating material 144 within the vertical transition structure 141 comprises the core substrate 112 material.

The interface structure 130 comprises high-frequency signal wiring structures that are patterned on a conductive layer M1 of the first laminated layer L1 of the interface structure 130, a first ground plane patterned on a second conductive layer M2 of the second laminated layer L2 of the interface structure 130, low-frequency wiring structures patterned on a conductive layer M3 of the third laminated layer L3 of the interface structure 130, a second (chip) ground plane patterned on a conductive layer M4 of the fourth laminated layer L4 of the interface structure 130, a plurality of vertical ground vias 131 extending through the first and second laminated layers L1 and L2 connecting the second ground plane 116 of the core substrate 112 to the ground plane of the second conductive layer M2, and a plurality of contact pads 132 patterned a conductive layer M5 of the fifth laminated layer L5.

The RFIC chip 150 comprises a plurality of contact pads 152 formed on an active side of the chip 150. The RFIC chip 150 comprises active circuit elements forming, for example, a receiver, a transmitter or a transceiver circuit, and other active or passive circuit elements that are commonly used to implement wireless RFIC chips. The contact pads 152 of the RFIC chip 150 include ground pads, DC power supply pads, input/output pads, control signal pads, etc., that form a portion of a BEOL (back end of line) wiring structure connected to integrated circuit components of the RFIC chip 150, as is readily understood by those of ordinary skill in the art. The RFIC chip 150 is flip-chip mounted to the interface structure 130 by connecting the contact pads 152 to corresponding contact pads 132 of the conductive layer M5 of the fifth laminated layer L5 of the interface structure 130 using standard techniques, such as solder ball connections 160.

The interface structure 130 comprises a plurality of transmission lines 145, 146, 147 and 148. In the illustrative embodiment of FIG. 1, the transmission lines 145, 147, and 148 are strip line transmission lines. Each strip line transmission line 145, 147, and 148 comprises a signal line formed by a portion of the patterned first conductive layer M1 disposed between first and second ground planes formed by the ground plane 116 of the core structure 110 and the ground plane formed by the second conductive layer M2. The portion 146 of the antenna feed line is a vertical transition structure 146 that is formed through two or more laminated layers of the interface structure 130. The vertical transition structure 146 is similar in structure to the vertical transition structure 141 discussed above, in that the vertical transition structure 146 comprises a center vertical conductor connected between a contact pad 132 on the patterned conductive layer M5 and a center conductor of the stripline transmission line 145 on the patterned conductive layer M1, and further comprises a series of vertical ground vias connecting the ground layers M2 and M4 (of the interface structure 130) surrounding the center conductor. In this regard, the vertical transition structure 146 is similar in structure and function to a coaxial transmission line.

The transmission lines 145 and 146 comprise portions of the antenna feed line structure that is routed through the interface structure 130. The various transmission lines 140, 141, 145 and 146 that form the antenna feed line serve to transmit electromagnetic energy between the antenna 122 and the corresponding contact pad 152 on the active surface of the RFIC chip 150, which is connected to a receiver, transmitter or transceiver circuit, for example, formed in the active side of the RFIC chip 150.

For very high frequency applications, the stripline transmission lines 145, 147 and 148 help to reduce interference effects of other package components such as power plane, low frequency control signal lines, and other transmission lines. The stripline sections 145, 147 and 148 can also reduce the complexities of antenna feed line routing especially for large package phased array applications. The vertical ground vias 131 can be implemented between adjacent stripline transmission lines 145, 148 and 145, 147 to reduce coupling between the stripline transmission lines. The coaxial transmission line 146 between the bottom stripline ground plane formed by the second conductive layer M2 and the chip ground plane formed by the fourth conductive layer M4 serves to improve antenna feed line performance, by reducing coupling effects between the antenna feed line and the surrounding components and preventing the antenna feed line from radiating. Moreover, in the embodiment of FIG. 1, the ground plane 116 formed on the bottom of the core substrate 112 serves as a ground plane for the transmission lines 145, 147 and 148 formed in the interface structure 130 and serves to reduce losses due to the lossy material forming the core substrate 112.

The laminated layers L3, L4, and L5 of the interface structure 130 implement various wiring structures for routing baseband signals and control signals to and from the RFIC chip 150 to other components, circuits or systems connected to the chip 150 via the interface structure 130. For instance, control signals can be routed to and from the RFIC chip 150 using a wiring structure 133 formed by vertical conducive vias formed in alignment through the insulating layers D4 and D5 of the laminated layers L4 and L5 and a wiring structure of the patterned conductive layer M3 of the third laminated layer of the interface structure 130. Moreover, a chip ground plane is formed by connecting the patterned conductive layer M4 of the fourth laminated layer L4 to a ground contact pad 152 on the RFIC chip 150 using a vertical via connection 134 formed through the insulating layer D5 of the fifth laminated layer L5.

In the embodiment of FIG. 1, the planar core structure 110 provides a structurally sturdy layer upon which to build the antenna and interface structures 120 and 130. In one embodiment, the planar core structure 110 comprises substrate 112 that is formed of standard FR4 material, or other standard materials that are typically used to construct a standard PCB (printed circuit board). The planar core structure 100 can be formed with other materials having mechanical and electrical properties that are similar to FR4, providing a relatively rigid structure to support the package structure. Depending on the application frequency, the planar core structure 110 can have a thickness in a range of about 10 mils to about 20 mils. For instance, for 94 GHz application, the thickness of the planar core structure is about 10 mils. Since the material forming the core substrate 112 is typically lossier than the buildup substrate, the vertical coaxial transition 141 that is formed through the core substrate 112 serves to reduce the loss and prevent parallel plate modes from occurring in the package structure 100. Moreover, as noted above, the laminated layers forming the antenna and interface structures 120 and 130 can be formed using state of the art fabrication techniques such as SLC or similar technologies, which can meet the requisite tolerances and design rules needed for high-frequency application in the range of 94 GHz and higher, for example. With an SLC process, each of the laminated layers are separately formed with a patterned metallization layer, and then bonded to each other with an appropriate adhesive or epoxy material. For instance, in one embodiment, each laminated layer may be formed of a dielectric/insulating material, such as commercially available ABF dielectric materials, or similar materials, with a thickness in a range of about 8 μm to about 33 μm. Moreover, the conductive layers can be formed of copper, gold, or other suitable conductive materials. Depending on the fabrication process employed, the conductive vias can be formed by drilling or etching via holes in a substrate layer, and then plating the via sidewalls with a conductive material or completely filling the via holes with a conductive material, using techniques readily understood by those of ordinary skill in the art.

It is to be understood that the number of laminated layers forming the antenna and interface structures will vary depending on the application, e.g., antenna structure, I/O routing requirements, power and ground plane requirements, etc. Those of ordinary skill in the art readily understand that the antenna performance parameters such as antenna radiation efficiency and bandwidth and operating resonant frequency will vary depending on the dielectric constant, loss tangent, and thickness of the dielectric/insulating materials that form the laminated layers. Moreover, the size and structure of the patch radiators 124 and 126 of the antenna 122 shown in FIG. 1 will determine the resonant frequency of the antenna, as is well understood to those of ordinary skill in the art.

Figure 2:
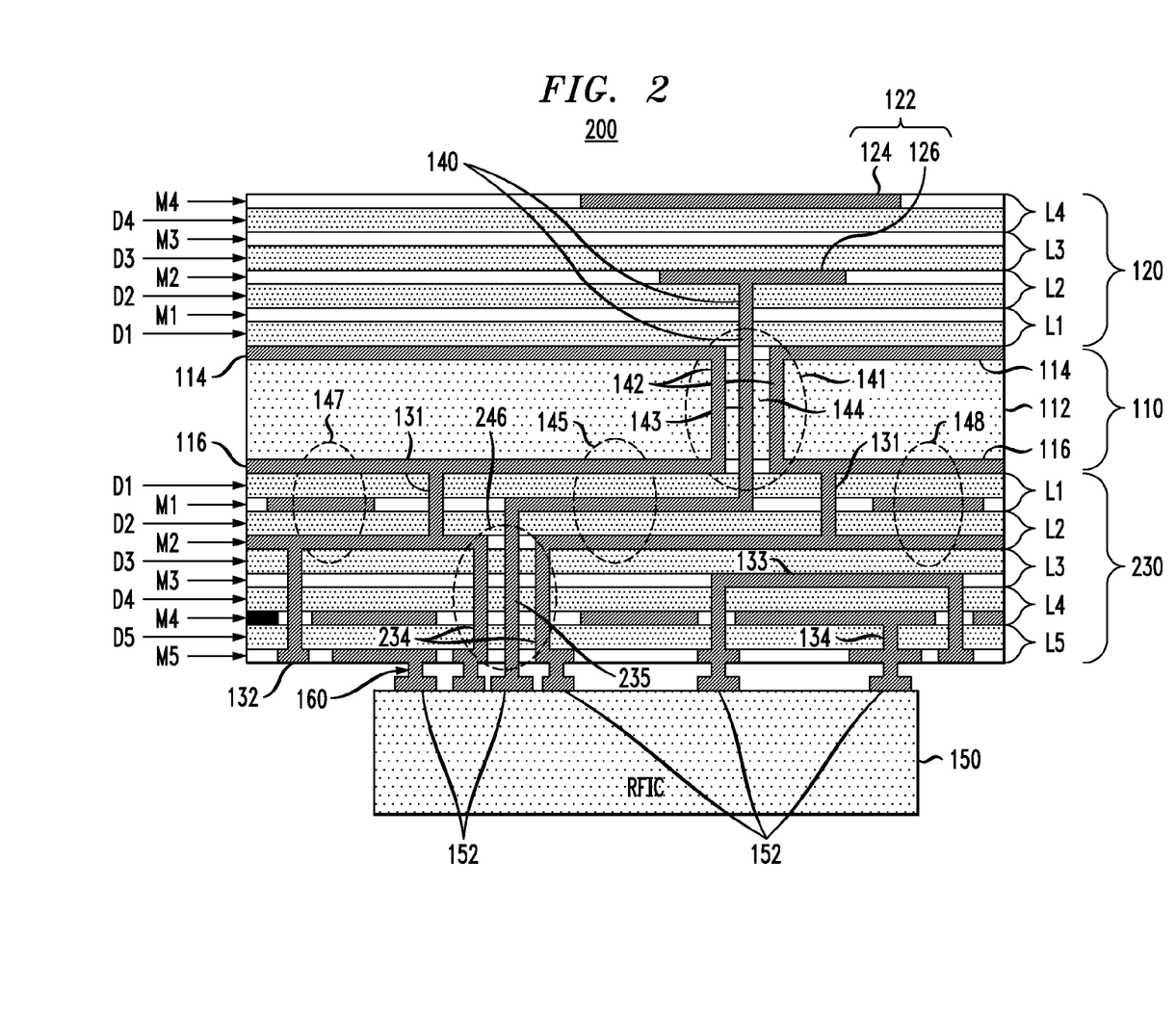
FIG. 2 schematically depicts a package structure according to another embodiment of the invention.

FIG. 2 schematically depicts a package structure according to another embodiment of the invention. In particular, FIG. 2 is a side schematic view of a package structure 200 comprising a planar core structure 110, an antenna structure 120 disposed on a first (upper) side of the planar core structure 110, an interface structure 230 disposed on a second (bottom) side of the planar core structure 110, an antenna feed line structure (140, 141, 145, 246), and an integrated circuit chip 150 (e.g., RFIC chip). The planar core structure 110, antenna structure 120 and RFIC chip 150 in the package structure 200 of FIG. 2 are the same or similar in structure as those components 110, 120 and 150 shown in FIG. 1. As such, a discussion on structural details of the package components 110, 120 and 150 will not be repeated.

The interface layer 230 shown in FIG. 2 is similar to the interface layer 130 of FIG. 1, except that in FIG. 2, a separate ground plane (M2) for the transmission lines 145, 147 and 148 is eliminated, and the patterned conductive layer M2 of the second laminated layer L2 of the interface structure 230 is used as both a chip ground plane and a lower ground plane for the transmission lines 145, 147 and 148. In this regard, a vertical transition structure 246 (which is similar in structure and function of a coaxial transmission line and which forms a portion of the antenna feed line) has a plurality of vertical ground vias 234 (framing an outer conductor) that each comprise a plurality of vertically aligned conductive vias formed through the insulating layers M3, M4 and M5 of the laminated layers L3, L4, L5 and connected to ground contact pads 152 on the active surface of the RFIC chip 150. The vertical transition structure 246 further comprises a center conductor 235 comprising a plurality of vertically aligned conductive vias formed through the insulating layers M3, M4 and M5 of the laminated layers L3, L4, L5 and connected to a signal feed contact pad 152 on the active surface of the RFIC chip 150. In the embodiment of FIG. 2, the bottom ground plane M2 of the striplines can be used as the chip ground plane in applications where the operating frequency is not too high and the package I/O routing is not complicated.

Figure 3:
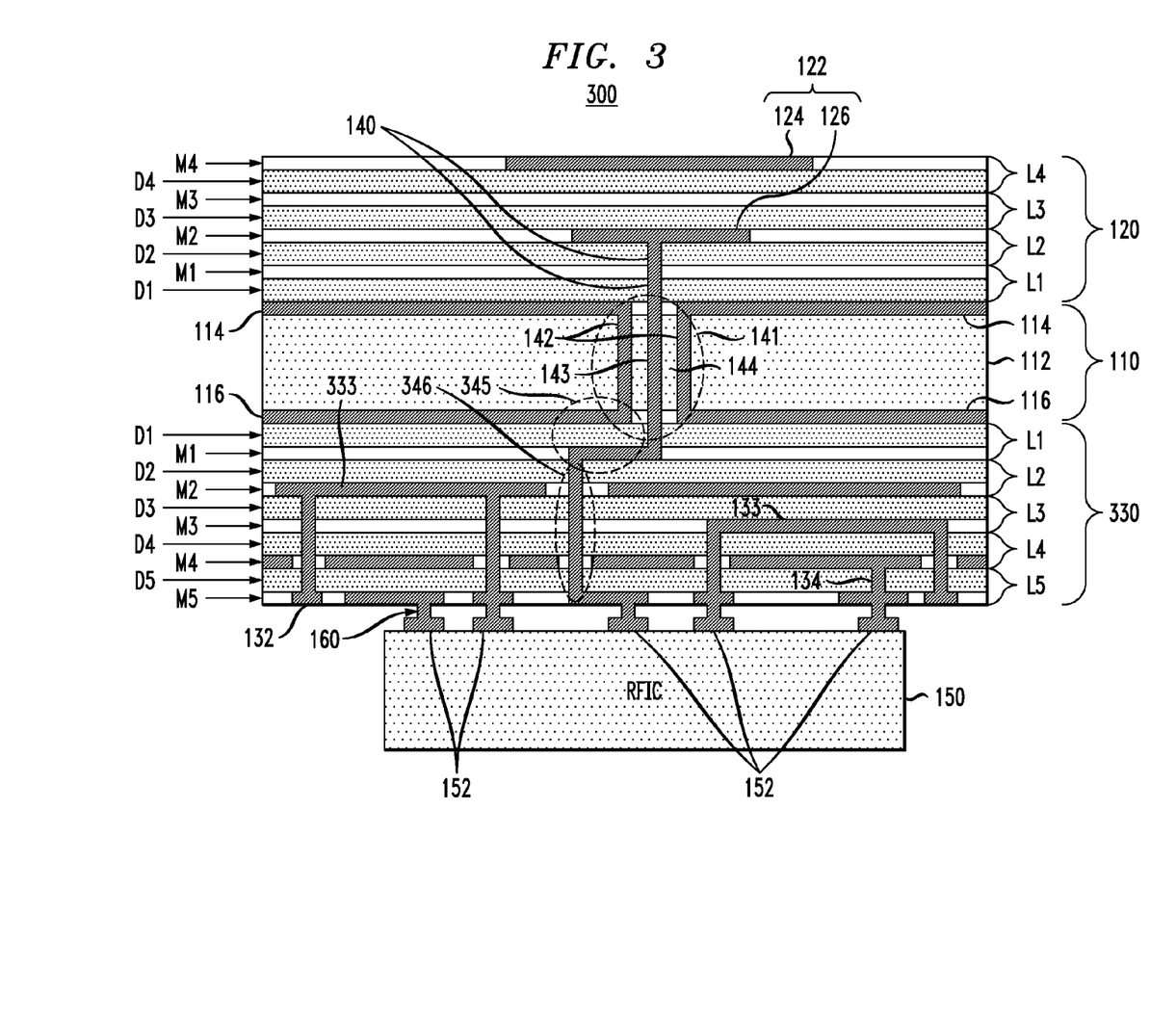
FIG. 3 schematically depicts a package structure according to another embodiment of the invention.

FIG. 3 schematically depicts a package structure according to another embodiment of the invention. In particular, FIG. 3 is a side schematic view of a package structure 300 comprising a planar core structure 110, an antenna structure 120 disposed on a first (upper) side of the planar core structure 110, an interface structure 330 disposed on a second (bottom) side of the planar core structure 110, an antenna feed line structure (140, 141, 345, 346), and an integrated circuit chip 150 (e.g., RFIC chip). The planar core structure 110, antenna structure 120 and RFIC chip 150 in the package structure 300 of FIG. 3 are the same or similar in structure as those components 110, 120 and 150 shown in FIG. 1. As such, a discussion on the structural details of the package components 110, 120 and 150 will not be repeated.

The interface structure 330 shown in FIG. 3 is similar to the interface structure 130 of FIG. 1, except that in FIG. 3, a separate ground plane (M2) used for the transmission lines 145, 147 and 148 is eliminated, and the patterned conductive layer M2 of the second laminated layer L2 of the interface structure 330 shown in FIG. 3 is used as a DC power plane. In the embodiment of FIG. 3, rather than using striplines as in previously discussed embodiments, one or more microstrip lines can be implemented in the laminated layers L1 and L2 for transmitting higher frequency signals in the package structure 300. For example, as shown in FIG. 3, a microstrip line 345 is formed as part of an antenna feed line, wherein the microstrip line 345 comprises a signal line patterned on the first conductive layer M1 and a ground plane implemented by the second ground plane 116 of the core substrate 112. Moreover, a portion of the antenna feed line shown in FIG. 3 is implemented by a simple vertical probe 346 (as opposed to a vertical coaxial line) which is formed by a plurality of vertically aligned conductive vias formed through the insulating layers M2, M3, M4 and M5 of the laminated layers L2, L3, L4, L5, and connected to a signal feed contact pad 152 on the active surface of the RFIC chip 150. The conductive layer M4 serves as a chip ground plane. Furthermore, in the embodiment of FIG. 3, the a portion 333 of the power plane formed on conductive layer M2 can be used to route DC supply connections between the RFIC chip 1110 and an external circuit or application board connected to the interface structure 330. The embodiment of FIG. 3 can be implemented when the low frequency components in the bottom buildup layers are properly designed to not affect, or be affected by, higher frequency signals that are routed on the antenna feed line or other microstrip lines formed in the laminated layers of the interface structure 330.

Figure 4:
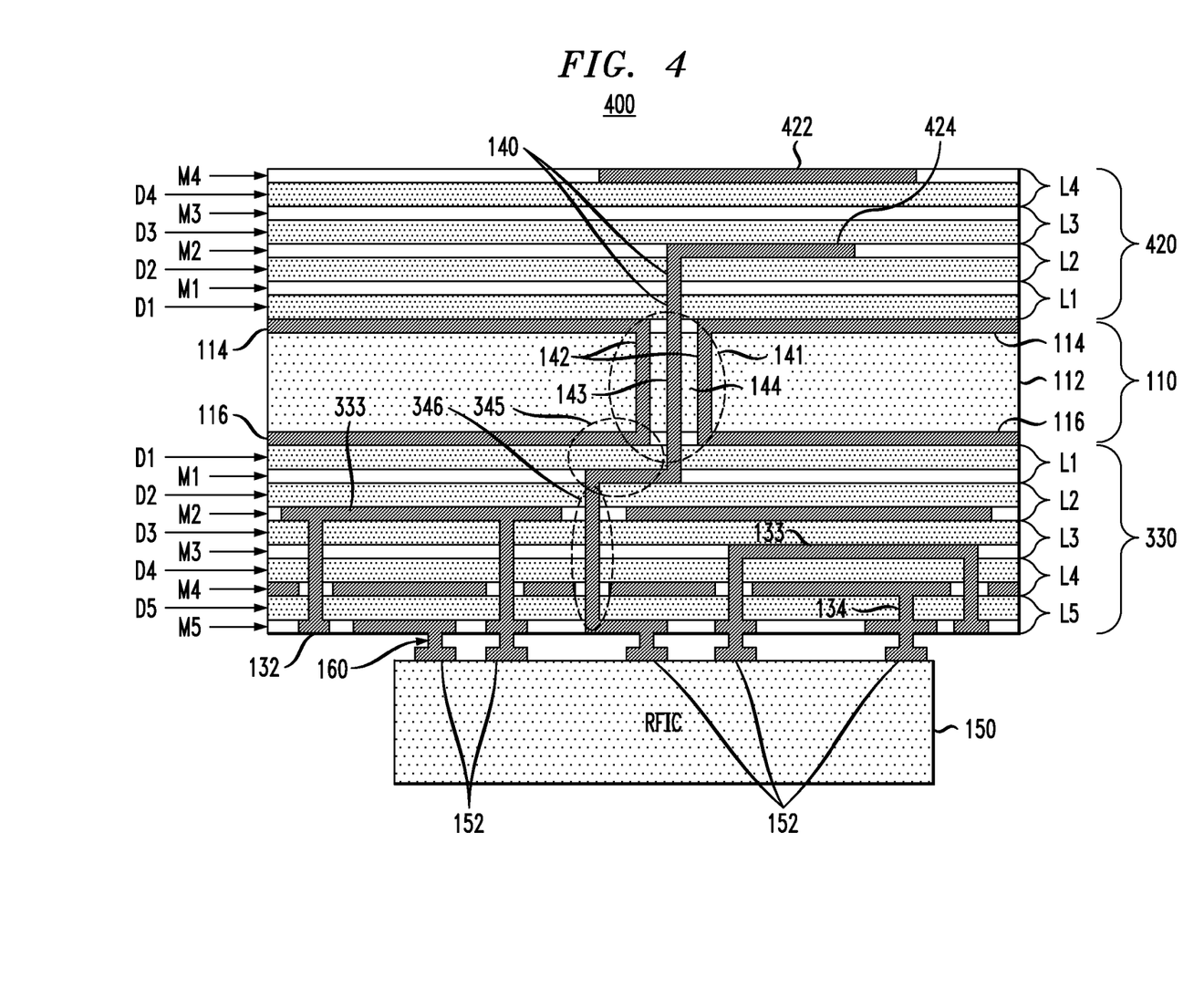
FIG. 4 schematically depicts a package structure according to another embodiment of the invention.

FIG. 4 schematically depicts a package structure according to another embodiment of the invention. In particular, FIG. 4 is a side schematic view of a package structure 400 comprising a planar core structure 110, an antenna structure 420 disposed on a first (upper) side of the planar core structure 110, an interface structure 330 disposed on a second (bottom) side of the planar core structure 110, an antenna feed line structure (424, 140, 141, 345, 346), and an integrated circuit chip 150 (e.g., RFIC chip). The planar core structure 110, interface structure 330 and RFIC chip 150 in the package structure 400 of FIG. 4 are the same or similar in structure as those components 110, 330 and 150 in the embodiment shown in FIG. 3. As such, a discussion on the structural details of the package components 110, 330 and 150 will not be repeated.

The antenna structure 420 shown in FIG. 4 includes a planar probe fed, coupled patch antenna structure, which comprises a patch radiator element 422 patterned on a conductive layer M4 of the uppermost laminated layer L4 of the antenna structure 420, and a feed line element 424 patterned on a conductive layer M2 of the second laminated layer L2 of the antenna structure 420 and disposed below the patch radiator element 422. The vertical probe 143 extending through the core substrate 112 is connected to the feed line element 424 by the vertical vias 140, thereby forming an L-shaped feed element that couples electromagnetic energy to and from the patch radiator element 422. In this embodiment, the first ground plane 114 formed on the first side of the core substrate 112 serves as an antenna ground plane, and as a ground plane for the horizontal feed line element 424, whereby a microstrip line is formed by the feed line element 424 and the ground plane 114.

Figure 5:
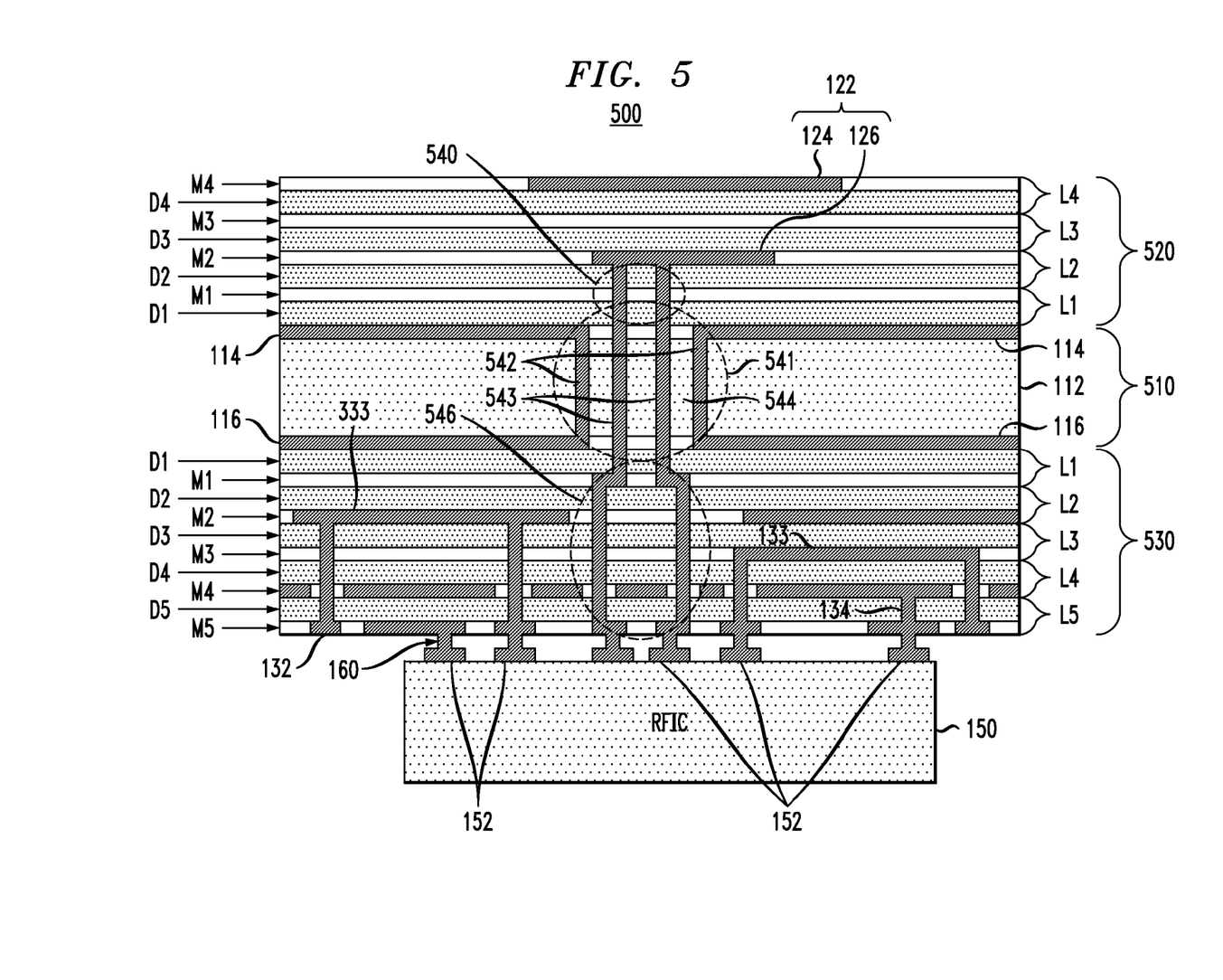
FIG. 5 schematically depicts a package structure according to another embodiment of the invention.

FIG. 5 schematically depicts a package structure according to another embodiment of the invention. In particular, FIG. 5 is a side schematic view of a package structure 500 comprising a planar core structure 510, an antenna structure 520 disposed on a first (upper) side of the planar core structure 510, an interface structure 530 disposed on a second (bottom) side of the planar core structure 110, an antenna feed line structure (540, 541, 546), and an integrated circuit chip 150 (e.g., RFIC chip). The antenna structure 520 of FIG. 5 is similar to the antenna structure 120 shown in FIG. 3, for example, except that the antenna structure 520 of FIG. 5 comprises a differential probe fed stacked patch antenna structure.

In particular, the planar antenna 122 shown in FIG. 5 comprises a first patch radiator element 124 patterned on a conductive layer M4 of an uppermost laminated layer L4 of the antenna structure 520, and a second patch radiator element 126 patterned on a conductive layer M2 of a second laminated layer L2 of the antenna structure 520, disposed below the uppermost laminated layer L4. The first patch radiator element 124 is larger in area than the second patch radiator element 126. With this antenna configuration, the ground plane 114 formed on the first side of the core substrate 112 serves as an antenna ground plane for the antenna radiators 124, 126.

The antenna structure 520 further comprises a plurality of conductive vias 540 that form a portion of a differential antenna feed line structure. The conductive vias 540 comprise two parallel differential lines formed in the first and second insulating layers D1, D2 of the first and second laminated layers L1, L2. The conductive vias 540 provide a dual (differential) vertical probe connection between the second patch radiator 126 and a vertical transition structure 541 that is formed in the planar core structure 510.

In particular, the vertical transition structure 541 comprises a plurality of ground vias 542 that are formed through the core substrate 112 connecting the first and second ground planes 114 and 116 on the first and second sides of the core substrate 112. The vertical transition structure 541 further comprises two center vertical conductors 543 that extend through the core substrate 112 connecting to connecting to corresponding vertical vias 540. The vertical ground vias 542 comprise a series of separate vias that are formed through the core substrate 112 surrounding the center vertical conductors 543, thus forming a transmission line structure that is similar to a coaxial transmission line, wherein the surrounding vertical ground vias 542 serve as an outer (shielding) conductor, and the center vertical vias 543 serves as differential center (signal) conductor. The plurality of vertical ground vias 542 may be arranged in a circular pattern surrounding the center vertical conductors 543, or other suitable pattern. An insulating material 544 within the vertical transition structure 541 comprises the core substrate 112 material.

The interface structure 530 shown in FIG. 5 is similar to the interface structure 330 shown in FIG. 3, except that a portion of the antenna feed line shown in FIG. 5 is implemented by a differential vertical probe structure 546 comprising two parallel differential signal lines that are formed by a plurality of vertically aligned conductive vias formed through the insulating layers M1, M2, M3, M4 and M5 of the laminated layers L1, L2, L3, L4, L5. The vertical probe structure 546 further comprise short horizontal offsets patterned in the first conductive layer M1 of the interface structure 530 to align the two differential lines of the vertical transition structure 546 with the two differential feed lines 543 of the vertical transition structure 541 in the planar core structure 510. The two differential signal lines of the vertical transition structure 546 are connected to a signal feed contact pad 152 on the active surface of the RFIC chip 150.

Figure 6:
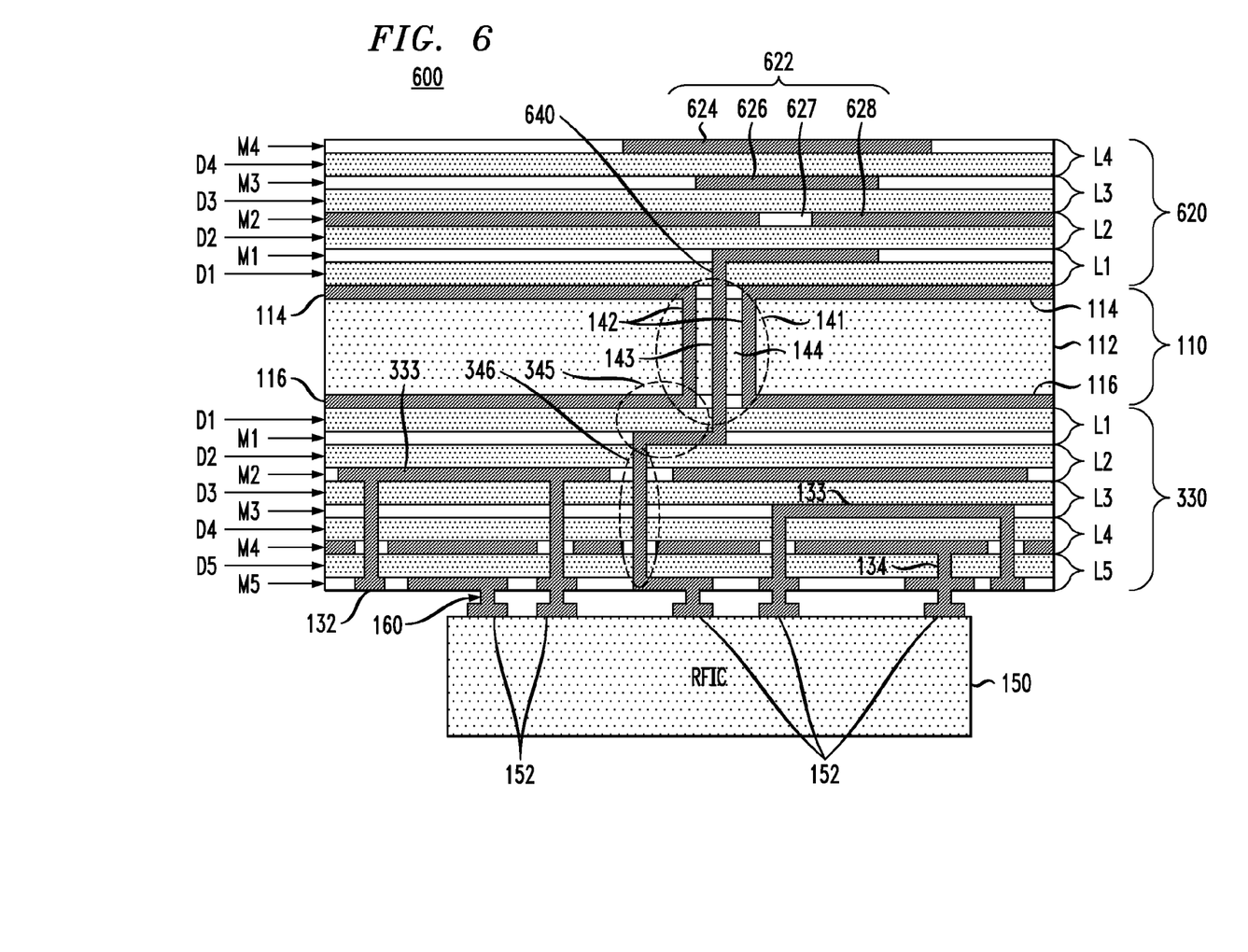
FIG. 6 schematically depicts a package structure according to another embodiment of the invention.

FIG. 6 schematically depicts a package structure according to another embodiment of the invention. In particular, FIG. 6 is a side schematic view of a package structure 600 comprising a planar core structure 110, an antenna structure 620 disposed on a first (upper) side of the planar core structure 110, an interface structure 330 disposed on a second (bottom) side of the planar core structure 110, an antenna feed line structure (642, 640 141, 345, 346), and an integrated circuit chip 150 (e.g., RFIC chip). The planar core structure 110, interface structure 330 and RFIC chip 150 in the package structure 600 of FIG. 6 are the same or similar in structure as those components 110, 330 and 150 in the embodiment shown in FIG. 3. As such, a discussion on the structural details of the package components 110, 330 and 150 will not be repeated.

The antenna structure 620 shown in FIG. 6 includes a planar aperture coupled stacked patch antenna structure 622 comprising a first patch radiator element 624 patterned on a conductive layer M4 of the uppermost laminated layer L4 of the antenna structure 620, a second patch radiator element 626 patterned on a conductive layer M3 of the third laminated layer L3 of the antenna structure 620, disposed below the first patch radiator element 624, and an antenna ground plane 628 formed on a conductive layer M2 of the second laminated layer L2 of the antenna structure 620, below the second patch radiator element 626. The antenna ground plane 628 comprises an aperture 627 formed therein, in alignment with the second patch radiator element 626. A feed line element 642 is patterned on the conductive layer M1 of the first laminated layer L1 of the antenna structure 620, disposed below the aperture 627. The vertical probe 143 extending through the core substrate 112 is connected to the feed line element 642 by the vertical via 640, thereby forming an L-shaped feed element that couples electromagnetic energy to and from the patch radiator element 626 through the aperture 627. In this embodiment, the antenna ground plane 628 and the ground plane 114 of the core substrate 112 serve as first and second ground planes for the horizontal feed line element 642, whereby a stripline transmission line is formed by the feed line element 642 disposed between the antenna ground plane 628 and the ground plane 114 of the core substrate 112.

Figure 7:
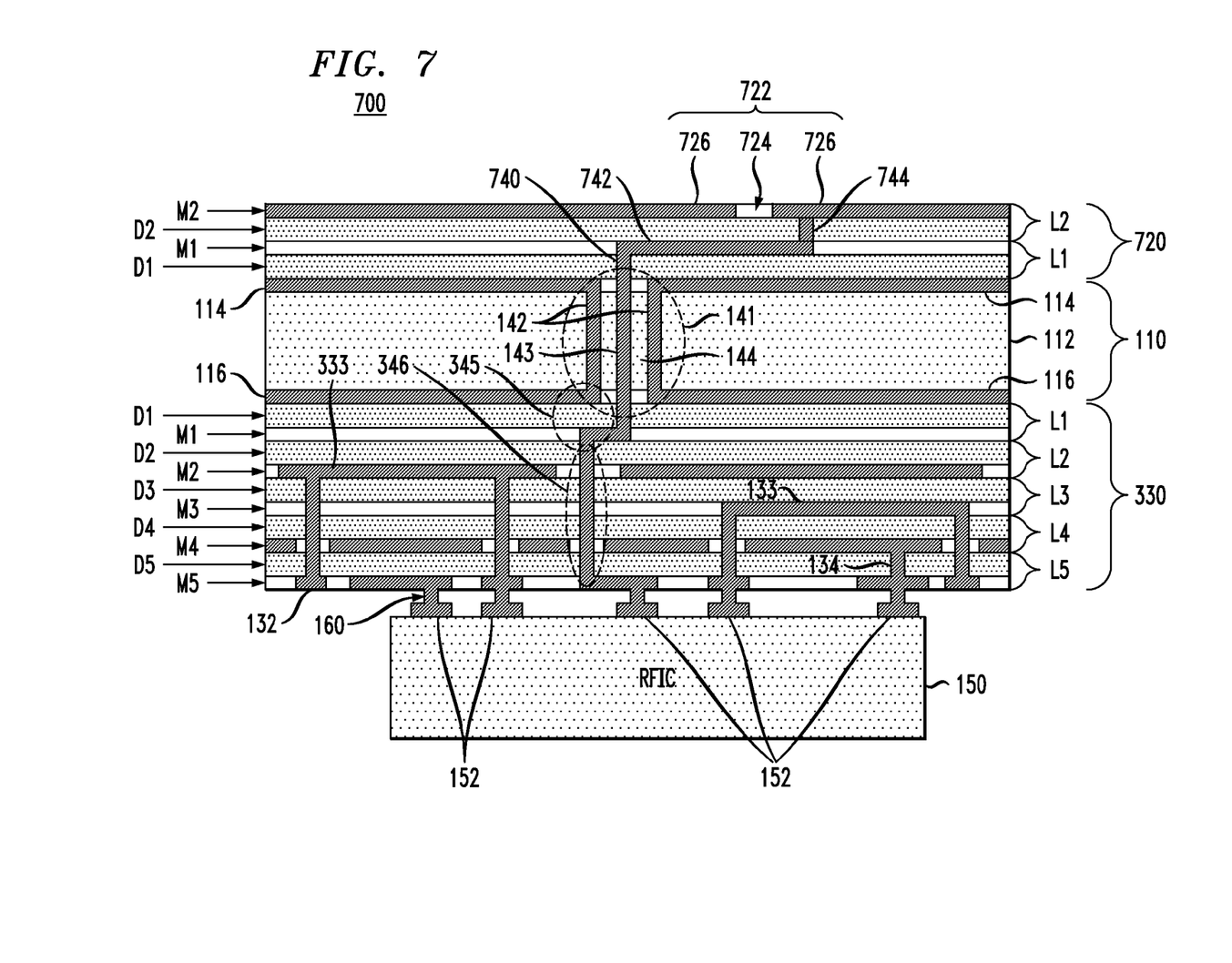
FIG. 7 schematically depicts a package structure according to another embodiment of the invention.

FIG. 7 schematically depicts a package structure according to another embodiment of the invention. In particular, FIG. 7 is a side schematic view of a package structure 700 comprising a planar core structure 110, an antenna structure 720 disposed on a first (upper) side of the planar core structure 110, an interface structure 330 disposed on a second (bottom) side of the planar core structure 110, an antenna feed line structure (742, 740 141, 345, 346), and an integrated circuit chip 150 (e.g., RFIC chip). The planar core structure 110, interface structure 330 and RFIC chip 150 in the package structure 700 of FIG. 7 are the same or similar in structure as those components 110, 330 and 150 in the embodiment shown in FIG. 3. As such, a discussion on the structural details of the package components 110, 330 and 150 will not be repeated.

The antenna structure 720 shown in FIG. 7 includes a planar slot antenna structure 722 comprising a radiator element 724/726 patterned on the conductive layer M2 of the uppermost laminated layer L2 of the antenna structure 720, wherein the radiator element comprises a slot element 724 formed in an antenna ground plane 726. A feed line element 742 is patterned on a conductive layer M1 of the first laminated layer L1 of the antenna structure 720, disposed below and in alignment with the slot element 724. The vertical probe 143 extending through the core substrate 112 is connected to the feed line element 742 by a via element 740, thereby forming an L-shaped feed element that couples electromagnetic energy to and from the radiator element 724/726. The feed line element 742 is disposed between the antenna ground plane 726 and the first ground plane 114 formed on the core substrate 112, thereby forming a stripline transmission line. In an alternative embodiment of FIG. 7, the antenna structure 720 includes a conductive via element 744 connecting an end portion of the feed line element 742 to the radiator element 726 adjacent the slot element 724 to provide a means antenna impedance matching, as is understood by those of ordinary skill in the art.

Figure 8:
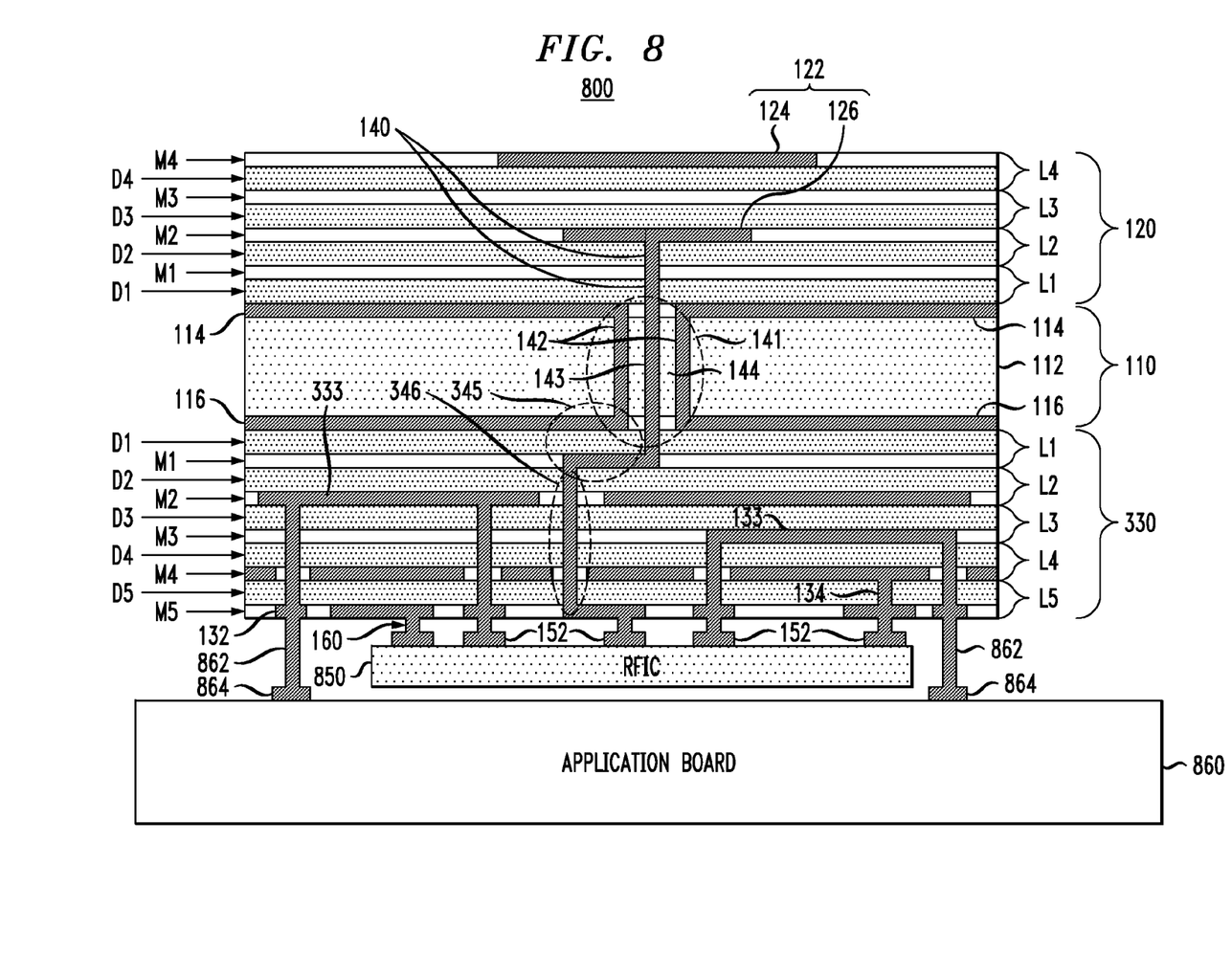
FIG. 8 schematically depicts a package structure according to another embodiment of the invention.

FIG. 8 schematically depicts a package structure according to another embodiment of the invention. In particular, FIG. 8 is a side schematic view of a package structure 800 comprising a planar core structure 110, an antenna structure 120 disposed on a first (upper) side of the planar core structure 110, an interface structure 330 disposed on a second (bottom)

side of the planar core structure 110, an antenna feed line structure (140 141, 345, 346), an integrated circuit chip 850 (e.g., RFIC chip) and an application board 860. The planar core structure 110, antenna structure 120, and interface structure 330 in the package structure 800 of FIG. 8 are the same or similar in structure as those components 110, 120 and 330 in the embodiment shown in FIG. 3. As such, a discussion on the structural details of the package components 110, 120 and 150 will not be repeated.

In the embodiment of FIG. 8, the backside of the RFIC chip is ground down to thin the RFIC chip so that the interface structure 330 can be mounted to the application board 860 with a plurality of BGA (ball grid array connections) 862 forming electrical connections between contact pads 132 on the conductive layer M5 of the interface structure 330 and contact pads 864 on the application board 860 using known techniques. Some BGA connections 862 may be non-electrical connections that are implemented to bond the interface structure 330 to the surface of the application board 860. Other BGA connections 862 serve as electrical connections between the application board 840 and the RFIC chip 850. For instance, as shown in FIG. 8, some BGA connections 826 are connected to metal traces 333 that are formed as part of the interface structure 330 to provide DC power from the application board to the RFIC chip 850. Other BGA connections 826 are connected to metal traces 133 that are formed as part of the interface structure 330 to send I/O or control signals between the RFIC chip 850 and the application board 860.

In an alternative embodiment, the application board 860 may be formed with an opening that insertably receives the RFIC chip 850, so that smaller vertical connections can be formed between the interface structure 330 and the application board 860. In this embodiment, the backside of the RFIC chip would not need to be ground down and thinned for the package to be mounted to the application board 860. Moreover, with the opening formed in the application board 860, an optional heat sink can be attached to the non-active surface of the RFIC chip 850, to provide means for dissipating heat generated by the RFIC chip 850.

In the illustrative embodiments discussed above with reference to FIGS. 1-8, a planar core structure is included in the package structure to provide structural integrity in applications where the build-up layers of the antenna and interface structures are relatively large in area for phase-array antenna applications where the package structure can include a large number of antennas. In other embodiments where the package structures are formed with one or two antennas, for example, the planar core structure may not be necessary to provide structural integrity to the package structure, and may be omitted.

Figure 9:
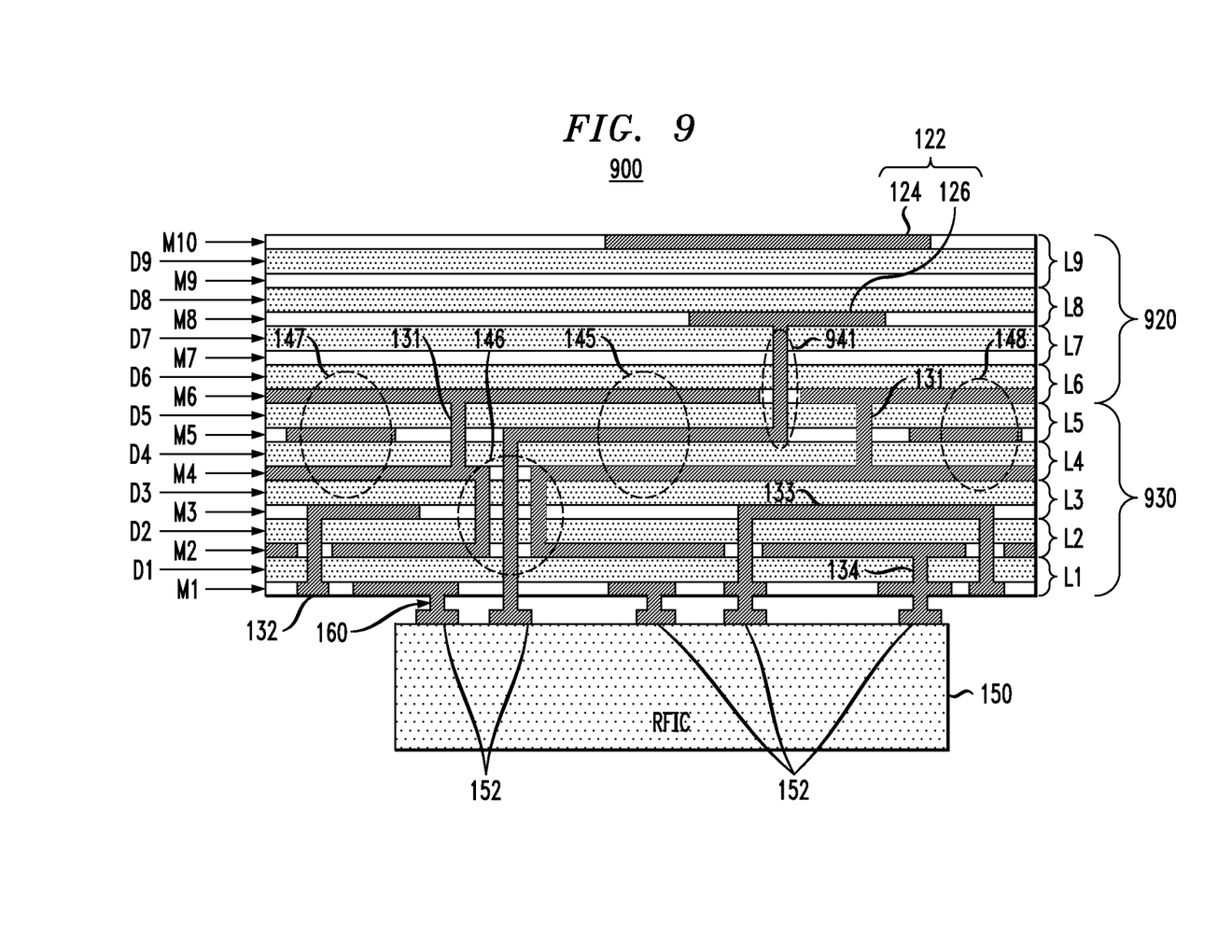
FIG. 9 schematically depicts a package structure according to another embodiment of the invention.

For example, FIG. 9 schematically depicts a package structure according to another embodiment of the invention, in which a planar core structure is not implemented for structural integrity. In particular, FIG. 9 is a side schematic view of a package structure 900 that comprises a plurality of laminated layers L1, L2, L3, L4, L5, L6, L7, L8, and L9 stacked on each other, each laminated layer comprising a patterned conductive layer formed on an insulating layer. A first (top) portion of the laminated layers (i.e., layers L6, L7, L8 and L9) comprises an antenna structure 920 that is similar in structure to the antenna structure 120 of FIG. 1. A second (bottom) portion of the laminated layers (i.e., L1, L2, L3, L4 and L5) comprises an interface structure 930 that is similar in structure to the interface structure 130 of FIG. 1.

The embodiment of FIG. 9 is similar to the embodiment of FIG. 1 except that the package structure 900 does not include the planar core structure 110 of FIG. 1, and the package structure 900 is built from the bottom layer L1 up to the top layer L9. As a final step, an additional conductive layer M10 is formed and patterned on the insulating layer D9 of the uppermost layer L9 to provide metallization for the antenna radiator 124. In the embodiment of FIG. 9, the patterned conductive layer M6 of layer L6 serves as a ground plane (similar in function to the ground planes 114 and 116 of the planar core structure 110 of FIG. 1), and vertical transition structure 941 connects the second radiator element 126 with the center conductor of the stripline transmission line 145 (eliminating the need for a coaxial-type transmission line structure 141 as shown in FIG. 1). In the embodiment of FIG. 9, the vertical transition structure 941 comprises a portion of an antenna feedline formed by structures 941, 145 and 146. The remaining elements/components shown in FIG. 9 are the same or similar in structure with the same reference numerals as shown in FIG. 1, and thus a detailed description thereof will not be repeated.

Those of ordinary skill in the art will readily appreciate the various advantages associated with integrated chip/antenna package structures according to embodiments of the invention. For instance, the package structure can be readily fabricated using known manufacturing and packaging techniques to fabricate and package antenna structures with semiconductor RFIC chips to form compact integrated radio/wireless communications systems for millimeter wave and Terahertz applications. Moreover, integrated chip packages according to embodiments of the invention enable antennas to be integrally packaged with IC chips such as transceiver chips, which provide compact designs with very low loss between the transceiver and the antenna. Various types of antenna designs can be implemented including patch antennas, slot antennas, slot ring antennas, dipole antennas, and cavity antennas, for example. Moreover, the use of integrated antenna/IC chip packages according to the present invention saves significant space, size, cost, and weight, which is a premium for virtually any commercial or military application.

Although embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A package structure, comprising:
   a planar core structure comprising a first side and a second side opposite the first side, wherein the planar core structure comprises as core substrate formed of an insulating material;
   an antenna structure disposed on the first side of the planar core structure, the antenna structure comprising a plurality of laminated layers, each laminated layer comprising a patterned conductive layer formed on an insulating layer, wherein the antenna structure comprises a planar antenna formed on one or more patterned conductive layers of the laminated layers of the antenna structure;
   an interface structure disposed on the second side of the planar core structure, wherein the interface structure comprises a plurality of laminated layers, each laminated layer comprising a patterned conductive layer formed on an insulating layer, wherein the interface structure comprises a power plane, a ground plane, signal lines, and contact pads formed on one or more patterned conductive layers of the laminated layers of the interface structure; and an antenna feed line structure formed in, and routed through, the interface structure and the planar core structure, and connected to the planar antenna, wherein the insulating material forming the core substrate is different from an insulating material forming the insulating layers of the antenna structure and interface structure.

2. The package structure of claim 1, wherein the planar core structure comprises an FR4 substrate.

3. The package structure of claim 1, wherein a portion of the antenna feed line which passes through the planar core structure comprises a vertical transition structure comprising at least one center vertical via that extends through the planar core structure and a plurality of grounded vertical vias which extend through the planar core structure and surround the at least one center vertical via.

4. The package structure of claim 1, where at least a portion of the antenna feed line structure formed in the interface structure comprises a vertical transition that passes through two or more laminated layers of the interface structure.

5. The package structure of claim 4, wherein the vertical transition comprises a center vertical via that extends through two or more laminated layers of the interface structure and a plurality of grounded vertical vias which extend through two or more laminated layers of the interface structure and surround the center vertical via.

6. The package structure of claim 1, wherein at least a portion of the antenna feed line structure formed in the interface structure comprises a stripline transmission line, wherein the stripline comprises a first ground plane, a second ground plane, and a signal line disposed between the first and second ground planes, wherein the signal line is formed on a first laminated layer of the interface structure, and at least one of the first and second ground planes is formed on a second laminated layer of the interface structure adjacent the first laminated layer of the interface structure.

7. The package structure of claim 6, wherein at least one of the first and second ground planes of the stripline is a conductive layer formed on the second side of the planar core structure.

8. The package structure of claim 1, wherein at least a portion of the antenna feed line structure formed in the interface structure comprises a microstrip line transmission line, wherein the microstrip line comprises a ground plane and a signal line disposed adjacent the ground plane.

9. The package structure of claim 8, wherein the ground plane of the microstrip line is a metallic layer formed on the second side of the planar core structure.

10. The package structure of claim 1, wherein the interface structure comprises a first transmission line and a second transmission line, and a ground via connecting a first around plane and a second ground plane in the interface structure, wherein the ground via is disposed between the first and second transmission lines to reduce coupling between the first and second transmission lines.

11. The package structure of claim 1, wherein the planar core structure further comprises:
a first ground plane formed on a first side of the core substrate;
a second ground plane formed on the second side of the core substrate;
a vertical transition structure formed in the core substrate, wherein the vertical transition structure is a portion of the antenna teed line, wherein the vertical transition structure comprises:
at least one vertical via extending through the core substrate; and
a plurality of ground vertical vias extending through the core substrate connecting the first and second ground planes on the first and second sides of the core substrate and surrounding the at least one vertical via.

12. The package structure of claim 11, wherein the planar antenna comprises a probe fed stacked patch antenna structure, comprising:
a first radiator element patterned on a conductive layer of an uppermost first laminated layer of the antenna structure;
a second radiator element patterned on a conductive layer of a second laminated layer of the antenna structure, disposed below the uppermost first laminated layer, and
an antenna ground plane formed by the first ground plane formed on a first side of the core substrate,
wherein the at least one vertical via extending through the core substrate is connected to the second radiator element.

13. The package structure of claim 12, wherein the first radiator element is larger in area than the second radiator element.

14. The package structure of claim 12, wherein the at least one vertical via extending through the core substrate comprises a first vertical via and a second vertical via forming a differential feed line, which is connected to the second radiator element.

15. The package structure of claim 11, wherein the planar antenna comprises a probe fed, coupled patch antenna structure, comprising:
a radiator element patterned on a conductive layer of an uppermost first laminated layer of the antenna structure;
a feed line element patterned on a conductive layer of a second laminated layer of the antenna structure, disposed below the uppermost first laminated layer; and
an antenna ground plane formed by the first ground plane formed on a first side of the core substrate,
wherein the at least one vertical via extending through the core substrate is connected to the feed line element forming an L-shaped feed element that couples electromagnetic energy to and from the first radiator element.

16. The package structure of claim 11, wherein the planar antenna comprises an aperture coupled stacked patch antenna structure, comprising:
a first radiator element patterned on a conductive layer of an uppermost first laminated layer of the antenna structure;
a second radiator element patterned on a conductive layer of a second laminated layer of the antenna structure, disposed below the uppermost first laminated layer, and
an antenna ground plane formed on a conductive layer of a third laminated layer of the antenna structure, below the second laminated layer, the antenna ground plane comprising an aperture formed therein, in alignment with the second radiator element; and
a feed line element patterned on a conductive layer of a fourth laminated layer of the antenna structure, disposed below the third laminated layer; and
wherein the at least one vertical via extending through the core substrate is connected to the feed line element forming an L-shaped feed element that couples electromagnetic energy to and from the second radiator element through the aperture of the antenna ground plane, and
wherein the feed line element patterned on the conductive layer of the fourth laminated layer is disposed between the antenna ground plane and the first ground plane formed on a first side of the core substrate, forming as stripline transmission line.

17. The package structure of claim 11, wherein the planar antenna comprises a slot antenna structure, comprising:
a radiator element patterned on as conductive layer of an uppermost first laminated layer of the antenna structure, wherein the radiator element comprises a slot element formed in an antenna ground plane; and
a feed line element patterned on a conductive layer of a second laminated layer of the antenna structure, disposed below the uppermost first laminated layer in alignment with the slot element;
wherein the at least one vertical via extending through the core substrate is connected to the feed line element forming an L-shaped feed element that couples electromagnetic energy to and from the radiator element, and
wherein the feed line element patterned, on the conductive layer of the second laminated layer is disposed between the antenna ground plane and the first ground plane formed on a first side of the core substrate, forming a stripline transmission line.

18. The package structure of claim 17, further comprising a conductive via element connecting an end portion of the feed line element to the radiator element adjacent the slot element.

19. The package structure of claim 1, wherein the antenna structure and the interlace structure are SLC (surface laminar circuit) structures.

20. The package structure of claim 1, further comprising an integrated circuit chip having contact pads formed on an active surface of the integrated circuit chip, wherein the integrated circuit chip is mounted to the interface layer by connecting the contact pads of the integrated circuit chip to the contact pads formed on a conductive layer of an outermost laminated layer of the interface structure.

21. The package structure of claim 1, wherein the core substrate has a thickness which is greater than a thickness of each insulating layer of the antenna structure and the interface structure.

22. The method of claim 1, wherein the core substrate has a thickness which is greater than a thickness of each insulating layer of the antenna structure and the interface structure.

23. An apparatus, comprising:
a package structure, comprising:
a planar core structure comprising a first side and a second side opposite the first side;
an antenna structure disposed on the first side of the planar core structure, the antenna structure comprising to plurality of laminated layers, each laminated layer comprising a patterned conductive layer formed on an insulating layer, wherein the antenna structure comprises a planar antenna formed on one or more patterned conductive layers of the laminated layers of the antenna structure;
an interface structure disposed on the second side of the planar core structure, wherein the interface structure comprises a plurality of laminated layers, each laminated layer comprising a patterned conductive layer formed on an insulating layer, wherein the interface structure comprises a power plane, a ground plane, signal lines, and contact pads formed on one or more patterned conductive layers of the laminated layers of the interface structure; and
an antenna feed line structure formed in, and routed through, the interface structure and the planar core structure, and connected to the planar antenna;
an RFIC (radio frequency integrated circuit) chip comprising a semiconductor substrate having an active surface and an inactive surface, and a BEOL (back end of line) structure formed on the active surface of the semiconductor substrate, wherein the RFIC chip is mounted to the package structure by connecting the BEOL structure of the RFIC chip to contact pads of the interface structure;
a circuit board mounted to package structure by connecting contact pads of the circuit board to contact pads of the interface structure.

24. The apparatus of claim 23, wherein the circuit board has an opening forming a window through which the RFIC chip is inserted.

25. The apparatus of claim 23, wherein the planar core structure comprises:
a core substrate formed of an insulating material;
a first ground plane formed on a first side of the core substrate;
a second ground plane formed on the second side of the core substrate;
a vertical transition structure formed in the core substrate wherein the vertical transition structure portion of the antenna feed line, wherein the vertical transition structure comprises:
at least one vertical via extending through the core substrate; and
a plurality of ground vertical vias extending through the core substrate connecting the first and second ground planes on the first and second sides of the core substrate and surrounding the at least one vertical via.

26. The apparatus of claim 25, wherein the core substrate core passes an FR4 substrate.

27. The apparatus of claim 23, wherein the antenna structure and the interface structure are SLC (surface laminar circuit) structures.

28. A method for constructing a package structure, comprising:
building an antenna structure on a first side of a planar core structure by stacking a plurality of discrete laminated layers on top of each other on the first side of the planar core structure, wherein each discrete laminated layer forming the antenna structure comprises a patterned conductive layer formed on an insulating layer, wherein the antenna structure comprises a planar antenna formed on one or more patterned conductive layers of the laminated layers of the antenna structure;
building an interface structure on a second side of the planar core structure, opposite the first side, by stacking a plurality of discrete laminated layers on top of each other on the second side of the planar core structure, wherein each discrete laminated layer forming the interface layer comprises a patterned conductive layer formed on an insulating layer, wherein the interface structure comprises a power plane, a ground plane, signal lines, and contact pads formed on one or more patterned conductive layers of the laminated layers of the interface structure; and
forming an antenna feed line structure in the package structure, which is routed through the interlace structure and the planar core structure, and connected to the planar antenna,
wherein the planar core structure comprises a core substrate formed of an insulating material, and wherein the insulating material forming the core substrate is different from an insulating material forming the insulating layers of the antenna structure and interface structure.

29. The method of claim 28, wherein the planar core structure further comprises:
- a first ground plane formed on a first side of the core substrate;
- a second ground plane formed on the second side of the core substrate;
- a vertical transition structure formed in the core substrate, wherein the vertical transition structure is a portion of the antenna feed line, wherein the vertical transition structure comprises:
  - at least one vertical via extending through the core substrate; and
  - a plurality of ground vertical vias extending through the core substrate connecting the first and second ground planes on the first and second sides of the core substrate and surrounding the at least one vertical via.

30. The method of claim 29, wherein the core substrate comprises an FR4 substrate.

31. The method of claim 28, wherein the antenna structure and the interface structure are constructed using an SLC (surface laminar circuit) buildup process.

32. The method of claim 28, further comprising mounting an integrated circuit chip to the interface layer by connecting contact pads of the integrated circuit chip to the contact pads formed on a conductive layer of an outermost laminated layer of the interface structure.

* * * * *